(12) United States Patent
von Malm et al.

(10) Patent No.: US 10,991,683 B2
(45) Date of Patent: Apr. 27, 2021

(54) METHOD OF PRODUCING AN OPTOELECTRONIC COMPONENT, AND OPTOELECTRONIC COMPONENT

(71) Applicant: OSRAM Opto Semiconductors GmbH, Regensburg (DE)

(72) Inventors: Norwin von Malm, Nittendorf (DE); Andreas Plössl, Regensburg (DE)

(73) Assignee: OSRAM OLED GmbH, Regensburg (DE)

( * ) Notice: Subject to any disclaimer, the term of this patent is extended or adjusted under 35 U.S.C. 154(b) by 0 days.

(21) Appl. No.: 16/486,559

(22) PCT Filed: Mar. 6, 2018

(86) PCT No.: PCT/EP2018/055472
§ 371 (c)(1),
(2) Date: Aug. 16, 2019

(87) PCT Pub. No.: WO2018/162480
PCT Pub. Date: Sep. 13, 2018

(65) Prior Publication Data
US 2020/0058630 A1 Feb. 20, 2020

(30) Foreign Application Priority Data
Mar. 8, 2017 (DE) ...................... 10 2017 104 886.3

(51) Int. Cl.
*H01L 25/16* (2006.01)
*H01L 23/00* (2006.01)
(Continued)

(52) U.S. Cl.
CPC ............ *H01L 25/167* (2013.01); *H01L 24/95* (2013.01); *H01L 25/0753* (2013.01);
(Continued)

(58) Field of Classification Search
CPC ... H01L 25/167; H01L 25/0753; H01L 24/95; H01L 33/0095; H01L 33/62; H01L 2924/01322; H01L 2933/0066
See application file for complete search history.

(56) References Cited

U.S. PATENT DOCUMENTS 5,904,545 A * 5/1999 Smith ................... G02F 1/1362
216/108
6,919,641 B2 * 7/2005 Onozawa ................ H01L 24/95
257/777
(Continued)

FOREIGN PATENT DOCUMENTS

| DE | 10 2009 008 032 A1 | 4/2010 |
|---|---|---|
| EP | 2 688 093 A1 | 1/2014 |
| WO | 2017/034268 A1 | 3/2017 |

OTHER PUBLICATIONS

Ehsan Saeedi et al., "Molten-Alloy Driven Self-Assembly for Nano and Micro Scale System Integration," Fluid Dynamics and Materials Processing (FDMP), vol. 2, No. 4, 2006, pp. 221-245.
(Continued)

*Primary Examiner* — Kyoung Lee
*Assistant Examiner* — Christina A Sylvia
(74) *Attorney, Agent, or Firm* — DLA Piper LLP (US)

(57) ABSTRACT

A method of manufacturing an optoelectronic component includes: A) providing a substrate, B) providing a metallic liquid arranged in a structured manner and in direct mechanical contact on the substrate and including at least one first metal, C) providing semiconductor chips each having a metallic termination layer on their rear side, the metallic termination layer including at least one second metal different from the first metal, and D) self-organized arranging the semiconductor chips on the metallic liquid so that the first metal and the second metal form at least one intermetallic compound having a higher re-melting tempera-
(Continued)

ture than the melting temperature of the metallic liquid, wherein the intermetallic compound is a connecting layer between the substrate and the semiconductor chips.

18 Claims, 10 Drawing Sheets

(51) Int. Cl.
    *H01L 25/075*     (2006.01)
    *H01L 33/00*     (2010.01)
    *H01L 33/40*     (2010.01)
    *H01L 33/56*     (2010.01)
    *H01L 33/62*     (2010.01)
    *H01L 33/32*     (2010.01)

(52) U.S. Cl.
    CPC .......... *H01L 33/0095* (2013.01); *H01L 33/40* (2013.01); *H01L 33/56* (2013.01); *H01L 33/62* (2013.01); *H01L 33/32* (2013.01); *H01L 2924/01322* (2013.01); *H01L 2933/005* (2013.01); *H01L 2933/0066* (2013.01)

(56) References Cited

U.S. PATENT DOCUMENTS

| 10,039,194 | B2* | 7/2018 | Serre | H01L 24/29 |
| 2004/0007384 | A1* | 1/2004 | Soga | H05K 3/3484 |
| | | | | 174/260 |
| 2007/0269914 | A1* | 11/2007 | Yeh | H01L 24/83 |
| | | | | 438/26 |
| 2011/0273410 | A1* | 11/2011 | Park | H01L 25/167 |
| | | | | 345/204 |

OTHER PUBLICATIONS

Jaehoon Chung et al., "Programmable Reconfigurable Self-Assembly: Parallel Heterogeneous Integration of Chip-Scale Components on Planar and Nonplanar Surfaces," Journal of Microelectromechanical Systems, vol. 15, No. 3, Jun. 2006, pp. 457-464.

Wei Zheng et al., "Fluidic Heterogeneous Microsystems Assembly and Packaging," Journal of Microelectromechanical Systems, vol. 15, No. 4, Aug. 2006, pp. 864-870.

Mei Liu et al., "On-demand multi-batch self-assembly of hybrid MEMS by patterning solders of different melting points," Journal of Micromechanics and Microengineering, vol. 17, 2007, pp. 2163-2167.

Christopher J. Morris et al., "Micro-scale metal contacts for capillary force-driven self-assembly," Journal of Micromechanics and Microengineering, vol. 18, 2008, pp. 1-10.

Cheng Lin et al., "Orientation-specific fluidic self-assembly process based on a capillary effect," Journal of Micromechanics and Microengineering, vol. 19, 2009, pp. 1-12.

Jun Nakano et al., "Fluidic Self-Assembly Using Molten Ga Bumps and Its Application to Resonant Tunneling Diodes," Japanese Journal of Applied Physics, vol. 52, No. 116501, 2013, pp. 1-5.

Shantonu Biswas et al., "Surface Tension Directed Fluidic Self-Assembly of Semiconductor Chips across Length Scales and Material Boundaries," Micromachines, vol. 7, No. 54, Mar. 2016, pp. 1-13.

* cited by examiner

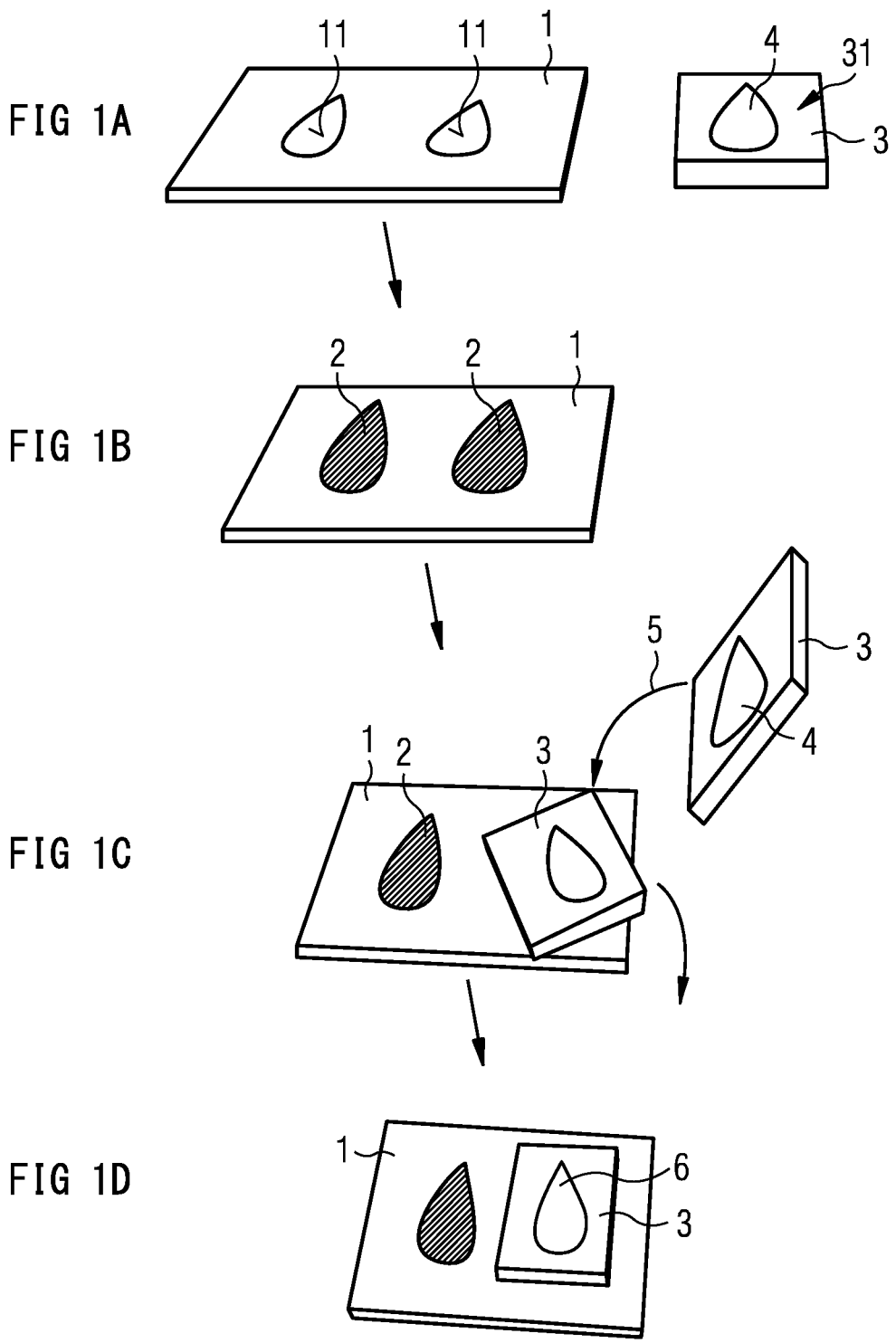

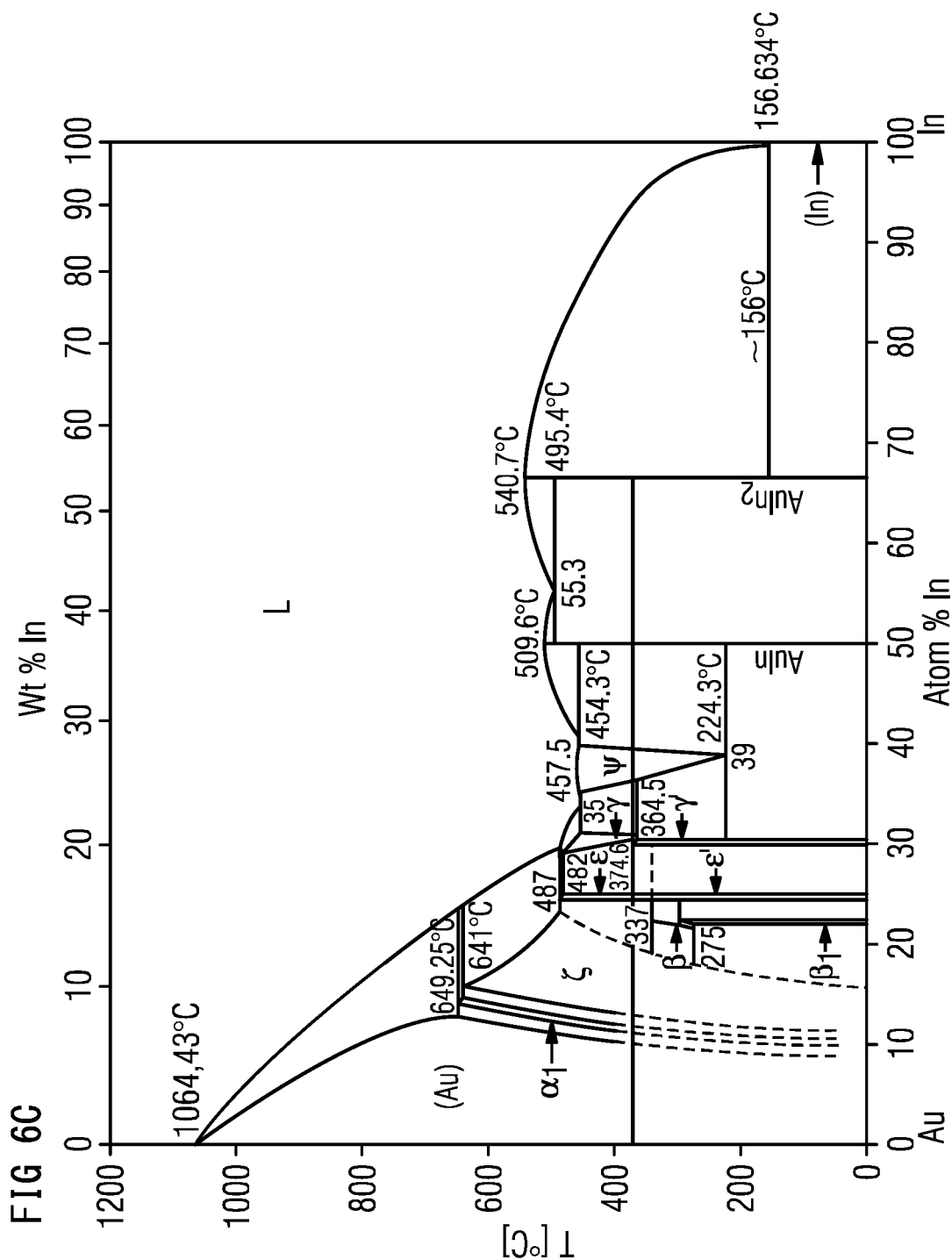

METHOD OF PRODUCING AN OPTOELECTRONIC COMPONENT, AND OPTOELECTRONIC COMPONENT

TECHNICAL FIELD

This disclosure relates to a method of manufacturing an optoelectronic component and an optoelectronic component.

BACKGROUND

It could be helpful to provide a method of manufacturing an optoelectronic component that allows for an easy manufacture of the optoelectronic component and to provide a cost-effective optoelectronic component.

SUMMARY

We provide a method of manufacturing an optoelectronic component including A) providing a substrate, B) providing a metallic liquid arranged in a structured manner and in direct mechanical contact on the substrate and including at least one first metal, C) providing semiconductor chips each having a metallic termination layer on their rear side, the metallic termination layer including at least one second metal different from the first metal, and D) self-organized arranging the semiconductor chips on the metallic liquid so that the first metal and the second metal form at least one intermetallic compound having a higher re-melting temperature than the melting temperature of the metallic liquid, wherein the intermetallic compound is a connecting layer between the substrate and the semiconductor chips.

We also provide an optoelectronic component obtained according to the method of manufacturing an optoelectronic component including A) providing a substrate, B) providing a metallic liquid arranged in a structured manner and in direct mechanical contact on the substrate and including at least one first metal, C) providing semiconductor chips each having a metallic termination layer on their rear side, the metallic termination layer including at least one second metal different from the first metal, and D) self-organized arranging the semiconductor chips on the metallic liquid so that the first metal and the second metal form at least one intermetallic compound having a higher re-melting temperature than the melting temperature of the metallic liquid, wherein the intermetallic compound is a connecting layer between the substrate and the semiconductor chips, the component including a composite of semiconductor chips arranged on a substrate.

BRIEF DESCRIPTION OF THE DRAWINGS

FIGS. 1A to 1D show a method of manufacturing an optoelectronic component according to an example.

FIGS. 6A to 6C each show a state diagram of metals.

Figure 2A:
FIGS. 2A to 2E show a method of manufacturing an optoelectronic component according to an example.

LIST OF REFERENCE SIGNS 100 optoelectronic component
1 substrate
11 landing area(s)
2 metallic liquid
3 semiconductor chip
31 rear side of the semiconductor chip
32 first type of semiconductor chips
33 second type of semiconductor chips
34 further type of semiconductor chips or n+2 semiconductor chips with n≥1
Me1 first metal
Me2 second metal
4 metallic termination layer
5 self-organized arrangement of semiconductor chips
6 intermetallic compound
7 covering layer
8 solvent
R red emitting semiconductor chip
G green emitting semiconductor chip
B blue emitting semiconductor chip
W white emitting semiconductor chip

DETAILED DESCRIPTION

Our method of manufacturing an optoelectronic component may comprise the steps of:
A) providing a substrate,
B) providing a metallic liquid arranged in a structured manner on the substrate and comprising at least one first metal,
C) providing semiconductor chips each having a metallic termination layer on their rear side, the metallic termination layer comprising at least one second metal different from the first metal, and
D) self-organized arranging the semiconductor chips on the metallic liquid so that the first metal and the second metal form at least one intermetallic compound having a higher re-melting temperature than the melting temperature of the metallic liquid.

In particular, the intermetallic compound serves as a connecting layer between the substrate and the semiconductor chips.

We recognized that a plurality of semiconductor chips formed either without or with housings can be specifically mounted on certain landing areas of the substrate without the need for an assembly arm that grips and places each individual semiconductor chip separately. The substrate and the landing areas do not have to be planar so they can also be non-planar. In particular, the semiconductor chips are composed of several types that differ in their function and/or geometry. We also recognized that the complex assembly of substrates such as printed circuit boards with a plurality of semiconductor chips that are geometrically identical or different or have different functions, can be considerably rationalized. In addition, the method enables an improved connection of the semiconductor chips to the substrate by the intermetallic compound. Preferably, a single metallic compound, in particular a single solder metal system, is used, which makes it considerably easier to ensure the long-term reliability of the assembled substrate.

The method may comprise step A): providing a substrate. The substrate may, for example, be a ceramic, a circuit board, a board or, in general, a plate formed with a plastic material, a metal, a ceramic material or a semiconductor material. The substrate can also be a PCB (Printed Circuit Board). Preferably, the substrate is a circuit board.

The substrate may have a plurality of landing areas. The landing areas may each be configured to accommodate a semiconductor chip. Landing areas are understood to be areas of the substrate on which the semiconductor chips orient themselves by self-organized arrangement. The metallic liquid is arranged on the landing areas. In a later method step, the rear side of the respective semiconductor chip can then be placed on the metallic liquid, whereby the intermetallic compound is formed.

The landing areas may be arranged in the form of a matrix with respect to each other in a plan view of the substrate.

The substrate may have a plurality of landing areas that are each configured to accommodate a semiconductor chip and on which the metallic liquid is arranged. The substrate may be introduced in a solvent. Subsequently, the semiconductor chips may be introduced into the solvent, wherein the semiconductor chips arrange themselves in a self-organized manner on the landing areas. The metallic liquid on the landing area and the second metal of the metallic termination layer form an intermetallic compound having a higher re-melting temperature than the melting temperature of the metallic liquid.

The method may comprise a step B): providing a metallic liquid. The metallic liquid may be arranged in a structured manner on the substrate. In particular, the metallic liquid is arranged on the landing areas of the substrate.

That a layer, element or liquid is arranged or applied "on" or "above" another layer, element or liquid can mean that one layer, element or liquid is arranged directly on, i.e., in direct mechanical and/or electrical contact with the other layer, element or liquid. Furthermore, it can also mean that one layer, element or liquid is arranged indirectly on or above the other layer, element or liquid. Further layers and/or elements and/or liquids can then be arranged between one layer and the other or between one element and the other or between one liquid and the other.

The metallic liquid may be applied to the substrate in a solid state of aggregation. This can be achieved, for example, by the melting temperature of the first metal being higher than the ambient temperature of the substrate. In the further method step, the ambient temperature can then be increased above the melting temperature of the metallic liquid and/or the first metal so that the metallic liquid on the substrate is finally liquid.

The metallic liquid may be an alloy or a mixture, i.e., it preferably contains other metals in addition to the first metal. In particular, the first metal is a component of the alloy or mixture. The alloy or mixture can, for example, be formed from bismuth, indium and tin.

The first metal may be a metal or a mixture of several metals and may be selected from the following group or combinations thereof: Gallium (Ga), indium silver (InAg), indium tin (InSn), indium tin zinc (InSnZn), bismuth indium (BiIn), bismuth indium tin (BiInSn), bismuth tin (BiSn), gallium indium (GaIn), gallium indium tin (GaInSn), gallium tin (GaSn).

The first metal may be selected from the following group: Ga, In, Ag, Sn, Zn, Bi. Alternatively, the first metal may contain a mixture of the abovementioned elements that in particular form the main component of the mixture. In addition, other elements with a small proportion may be present in the mixture. In particular, the first metal has a melting temperature of less than 85° C. or less than 160° C.

The metallic liquid may be formed as a eutectic mixture. The metallic liquid preferably has a melting temperature below the ambient temperature of the substrate and/or the boiling temperature of a solvent.

The method may comprise a step C), providing semiconductor chips. The semiconductor chips may have a front side and a rear side. At least one metallic termination layer may be arranged on the rear side of each semiconductor chip. The term rear side can be used to refer to the side of the semiconductor chip opposite the main radiation exit surface. The rear side can also be defined as the side of the semiconductor chip in direct mechanical contact with the metallic liquid during production. The main radiation exit area is the area over which at least the majority of the radiation of the semiconductor chip is emitted. The main radiation exit surface is perpendicular to the growth direction of the semiconductor layer sequence of the semiconductor chip. The metallic termination layer comprises a second metal. The second metal is different from the first metal.

More than one semiconductor chip, for example, two, three, four, five, ten, $10^5$, $10^6$ or $10^7$ semiconductor chips, are arranged on the substrate. The semiconductor chips are preferably arranged on the substrate in the form of a matrix.

The semiconductor chip may comprise a semiconductor layer sequence. The semiconductor layer sequence of the semiconductor chip is preferably based on a III-V compound semiconductor material. The semiconductor material is, for example, a nitride compound semiconductor material such as $Al_n In_{1-n-m} Ga_m N$ or a phosphide compound semiconductor material such as $Al_n In_{1-n-m} Ga_m P$ or also an arsenide compound semiconductor material such as $Al_n In_{1-n-m} Ga_m As$, where $0 \leq n \leq 1$, $0 \leq m \leq 1$ and $n+m \leq 1$. The semiconductor layer sequence may contain dopants as well as additional components. For the sake of simplicity, however, only the essential components of the crystal lattice of the semiconductor layer sequence, i.e., Al, As, Ga, In, N or P, are given, even if they may be partially replaced and/or supplemented by small quantities of other substances.

The semiconductor layer sequence comprises an active layer with at least one pn-junction and/or with one or more quantum well structures. During operation of the semiconductor chip, electromagnetic radiation is generated in the active layer. The semiconductor chip is thus configured to emit radiation during operation. A wavelength, the maximum wavelength or peak wavelength of the radiation is preferably in the ultraviolet and/or visible spectral range, especially at wavelengths of 420 nm to 680 nm, for example, 440 nm to 480 nm.

The semiconductor chip may be a light-emitting diode, or LED for short. The semiconductor chip is preferably configured to emit blue, red, green or white light.

The semiconductor chip may be designed as a flip chip. This means that the semiconductor chip has all its electrical contacts arranged on one side. In particular, the semiconductor chip has all the electrical contacts on its rear side. With the flip chip, the contacts in particular are then arranged between the semiconductor layer sequence and the substrate. The flip chip can be designed as a sapphire flip chip. Such semiconductor chips have the advantage that no additional electrical contacts, for example, in the form of bond wires are required for the electrical connection.

Alternatively or additionally, the semiconductor chip can also be designed as a so-called thin-film chip. Thin-film chips are known in terms of their structure and are therefore not explained in detail.

The semiconductor chips may be designed as so-called chip-size package components. Chip-size or chip-scale package can designate a component that is not significantly larger than the pure semiconductor chip. This often implies a component whose base area is no more than 1.2 times that of the semiconductor chip. Usually, all electrical connection surfaces are then on one side ("mounting side"). Chip-scale packages of LEDs are possible with volume and surface emitters. Thin-film chips are typical surface emitters.

The semiconductor chips each have at least one metallic termination layer on their rear side. The metallic termination layer can completely or partially cover the rear side of the semiconductor chip. The metallic termination layer can also be round or drop-shaped.

The metallic termination layer may comprise a second metal. The second metal may be a metal or a mixture of several metals and may be selected from the following group or combinations thereof: Gold (Au), silver (Ag), copper (Cu), palladium (Pd), platinum (Pt), nickel (Ni), nickel gold (NiAu), nickel palladium gold (NiPdAu). The second metal and the metallic liquid react chemically in or after step D) to form an intermetallic compound. The intermetallic compound is in particular different from the first, second metal and the composition of the metallic liquid. Termination layers with Ni/Au or Ni/Pd/Au are particularly formed as layer stacks. For example, a nobler layer of Au or Pd is applied to a (base) nickel layer as an oxidation protection or wetting aid. The Au, which can be applied over the Pd, usually forms islands rather than a continuous layer. In particular, Ni/Au or Ni/Pd/Au is not an alloy or a more or less homogeneous mixture of these elements.

The second metal may be selected from the following group: Ag, Au, Cu, Ni, Pd, Pt. Alternatively, the second metal may comprise a mixture of the abovementioned elements that in particular form the main component of the mixture. The mixture may contain small proportions of other elements.

The method may comprise a step D), self-organized arrangement of the semiconductor chips on the metallic liquid so that the first metal and the second metal form at least one intermetallic compound having a re-melting temperature higher than the melting temperature of the metallic liquid.

A self-organized arrangement or arranging means that the semiconductor chips attach themselves to the metallic liquid of the landing areas as a result of the surface tension of liquid metals. This principle is well known such as from B is was et al., Micromachines 2016, 7, 54, pages 1 to 13, for example, the subject matter of which is incorporated herein by reference. However, the method described in B is was does not describe sequential application of the semiconductor chips and formation of the intermetallic compound.

The component may comprise an intermetallic compound. Preferably, the component also comprises more than one intermetallic compound. The intermetallic compound may have a higher re-melting temperature than the melting temperature of the metallic liquid.

The re-melting temperature of the intermetallic compound may be greater than 260° C., 280° C. or 300° C. This can be achieved by depleting the concentration of a low-melting component in the metallic liquid after mounting the semiconductor chips on the substrate, thereby raising the melting point for the intermetallic compound above 260° C. In particular, the intermetallic compound serves as a connecting layer between the substrate and the semiconductor chips. Preferably, the intermetallic compound is a solder metal system. The first metal and possibly other metals can, for example, form a eutectic mixture with a low melting point in the metallic liquid. By admixing the second metal as a result of the assembly of the semiconductor chips, at least one intermetallic compound is formed having a higher melting point than the melting point of the eutectic mixture.

The re-melting temperature of the mounted chips is to be increased by appropriately changing the composition of the initially liquid melt when the melt reacts with the metal or metals of the chip mounting surface. One such possible change is to convert the melt into a solid solution in this metal layer by reacting it with a solid metal layer. For example, the landing areas can be coated with gallium. At 45° C., the liquid Ga captures a chip with a thick Ag rear side. If all Ga has diffused into the Ag layer and only makes up about 10 mol % of the Ag—Ga composition there, there is a solid solution of Ga in Ag, which only melts again well above 600° C. In this example, the desired consolidation of the compound is thus achieved without having formed an intermetallic compound. Another possibility is to form intermetallic compounds whose melting point is correspondingly higher. In the simple example with Ga as a solder and Ag as a chip rear side, the aim may also be to form the intermetallic compound ζ'-AgGa ("zeta-line"-AgGa), whose Ga content at 220° C. is 25 to 33 mol %. If, for example, Ga or GaInSn represents the solder system, the intermetallic compound may rather be to be classified outside since an additional element such as Ag or Au is added.

Step D) may be sequential. This means that not all landing areas of the substrate are occupied simultaneously with the semiconductor chips, but that the arrangement of the semiconductor chips on the landing areas of the substrate takes place step by step.

In step D), first, one type of semiconductor chips, then a second type of semiconductor chips and then optionally further types of semiconductor chips may arrange themselves in a self-organized manner. The types of semiconductor chips differ particularly in their geometry. Alternatively or additionally, the types of semiconductor chips are also configured to emit radiation, the peak wave maxima of the radiations of the first, second and/or further type of semiconductor chips being different. In other words, semiconductor chips that emit radiation of different wavelengths can preferably be applied sequentially to the substrate. For example, blue emitting semiconductor chips can be applied to the substrate first, followed by red emitting semiconductor chips and then green and/or white emitting semiconductor chips.

The metallic liquid may be arranged on all landing areas. Subsequently, at least part of the landing areas may be covered with a covering layer so that the semiconductor chips arrange themselves in a self-organized manner exclusively on the uncovered landing areas, and the covered landing areas remain free of the semiconductor chips.

The metallic liquid may be arranged on all landing areas. Subsequently, all landing areas may be covered with a covering layer and then the covering layer may be removed from part of the covered landing areas again so that the semiconductor chips arrange themselves in a self-organized manner exclusively on the uncovered landing areas, and the covered landing areas remain free of the semiconductor chips.

In addition, the covering layer can then be removed from part of the covered landing areas so that uncovered landing areas are produced, and further semiconductor chips can subsequently arrange themselves in a self-organized or self-oriented manner exclusively on the uncovered landing areas, and the covered landing areas remain free of the semiconductor chips. In other words, for example, blue emitting semiconductor chips can be applied to the substrate first, followed by green emitting semiconductor chips, for example. Alternatively or additionally, application of semiconductor chips of different geometries is also possible.

The covering layer may be a photoresist layer. The photoresist layer can be removed and/or applied by lithography.

The covering layer may be removed sequentially from the landing areas. Removal continues until one semiconductor chip has arranged itself in a self-organized manner on each of the landing areas. In other words, application of the semiconductor layer sequences on uncovered landing areas can be repeated until all landing areas are covered.

The semiconductor chips may be added in excess. After step D), the semiconductor chips having not arranged themselves in a self-organized manner are removed.

For example, five landing areas are arranged on the substrate, each with a metallic liquid. This means that five semiconductor chips can arrange themselves on the landing areas, respectively. Ten semiconductor chips are added, i.e., in excess, and five of the semiconductor chips arrange themselves on the landing areas by self-organization. The excess five semiconductor chips are then removed in a subsequent step. Preferably, the substrate and the semiconductor chips are in a solvent such as water. The semiconductor chips are then placed on the surface of the water and the substrate is completely surrounded by the water. Due to the self-organization of the semiconductor chips to the metallic liquid of the substrate, five semiconductor chips are then arranged and the remaining semiconductor chips not arranged in a self-organized manner, are then removed again.

The solvent, for example, water, may be removed after step D). The semiconductor chips can then be cleaned by evaporation or a cleaning reagent.

The solvents used may be water, heptane, toluene, butanol, pentanol, butyl acetate, 1-methoxy-2-propylacetate (PGMEA) monoethylene glycol or a combination thereof. 1-methoxy-2-propylacetate has a boiling point of about 146° C. In principle, other suitable solvents can also be used.

We also provide an optoelectronic component. The optoelectronic component is preferably manufactured using the methods described here. The optoelectronic component preferably comprises a composite of semiconductor chips arranged on a substrate. The semiconductor chips are fixed to the substrate in particular via the metallic compound. All definitions and explanations of the method also apply to the component and vice versa.

Luminescent diodes (LEDs) are particularly suitable as semiconductor chips. They are often assigned to different groups or species according to their color in the sense of emission spectra, the light emitting diodes of a group or a species essentially all emitting in the same color.

The component may have at least one pixel with at least three emission colors. Such triples (3-tuples) can be obtained from a substrate with a large number of landing areas by singulation.

The component may be in the form of a display device manufactured by the method described herein and/or be composed of, or comprise, a plurality of pixels and/or components.

So far, there are various approaches to assemble semiconductor chips on substrates and rationalizing this method. Parallelization and self-organized assembly can be considered. These two approaches are promising. Parallelization can be achieved, for example, in so-called micro-transfer printing. A disadvantage of parallelizing is the limited choice of the distances between the semiconductor chips on the landing areas. In addition, a flat substrate is necessary. Defective semiconductor chips must be replaced by individual assembly steps.

Self-organization, for example, can be sequential. Also, size differences of the semiconductor chips can be used to achieve sequential arrangement. First, for example, large semiconductor chips can be placed, which are denied access to the landing areas for the smaller semiconductor chips according to the key lock principle, before the smaller semiconductor chips are placed in a further method step. With this method, however, it is not possible to place semiconductor chips of the same size but different emission colors.

Alternatively, different types of semiconductor chips can be sequentially arranged on the landing areas and the metallic liquid can be generated by using an electric heater. Such electric heaters, however, require additional effort. In addition, the performance of the resulting system is enormously limited by an electric heater, for example, because the necessary insulation layers hinder the dissipation of power loss during operation.

Alternatively, metals of different solidus temperatures can be used and the temperature can be increased in stages to provide several landing areas with metallic liquid for the semiconductor chips. A subsequent cooling below the solidus temperature then fixes the corresponding semiconductor chips to the substrate.

Covering with photoresist is possible to selectively coat certain landing areas with the metallic liquid.

The method uses a metallic liquid for the self-organized assembly of semiconductor chips. This requires at least the first metal of the metallic liquid to have quite mild melting temperatures, with temperatures below 200° C. being preferred. Preferably, the first metal or metallic liquid has a melting temperature below 100° C. Water in particular can then be used as the solvent to suspend the semiconductor chips. The low melting point of the metals simultaneously defines the re-melting temperature of the connection between semiconductor chip and substrate and thus limits the maximum permissible application temperature.

With re-melting temperatures below 260° C., it is generally not possible to manufacture components that can be sold with surface mount capability. This problem is solved with our method.

We discovered that semiconductor chips of the same geometry, but belonging to different types of semiconductor chips, can be applied specifically to certain landing areas of the substrate. This can be done by making use of the surface tension of the metallic liquid, the semiconductor chips assembling themselves in a self-organized manner if, for example, the landing areas are exposed in groups.

On the one hand, a photoresist layer can cover the landing areas intended for the semiconductor chips to be mounted in a later method step. A sequence of different photoresist masks can define the corresponding types of semiconductor chips to be oriented to the corresponding landing areas.

Alternatively, the landing areas can also be created, i.e., covered with the metallic liquid, sequentially first. The sequence of the different photoresist masks can be generated prior to any assembly operation or alternately with the corresponding assembly step. The complex assembly of substrates, especially circuit boards with a plurality of geometrically identical semiconductor chips of several types, which, for example, have different functions, can thus be considerably rationalized. Only components tested as good, which may be bulk solids, can also be mounted on non-planar substrates. The required photolithography masks can be generated alternately with the corresponding assembly operations. The landing areas can be equipped with a new metallic liquid to capture the semiconductor chips.

If all the necessary coating layers are applied before the assembly process, simple sub-processes are possible in photolithography since no significant differences in height need to be compensated for without already placed components. In this example, the landing area for capturing the semiconductor chips can also be coated with a layer of metal that is liquid during the assembly process, in particular comprising the first metal.

Alternatively, the semiconductor chips can also be equipped with a meltable metallic liquid that is then liquid during assembly. One type of semiconductor chips can use one variant. The other type of semiconductor chips can use the other variant. If the landing areas are equipped with the metallic liquid for mounting, m–1 masks or masking steps can be used for m different types of semiconductor chips. Application of the liquid solder layer onto the semiconductor chips is possible, but less preferred, since two semiconductor chips, when they touch each other in the solution with their liquid metal layers, can bind to each other and are thus no longer available for assembly of the circuit board or utilization.

The main advantage of the method is that the semiconductor chips can be connected to the substrate in such a robust and temperature-stable way that further method steps can take place well above the assembly temperature, for example, to encapsulate the semiconductor chips to protect them from moisture or put the components obtained in this way together into assemblies using surface-mounting methods. In particular, the method requires only a single intermetallic compound that makes it much easier to ensure the long-term reliability of the mounted assemblies.

The metallic liquid may comprise an alloy of Bi, In and Sn, wherein the second metal is Au, wherein the intermetallic compound comprises AuSn and/or AuIn.

In the following, examples will be described.

EXAMPLE 1

The landing areas on the substrate, for example, the landing areas on a ceramic, metal core or synthetic resin circuit board, are assembled or treated simultaneously for all semiconductor chips with a metallic liquid that is already liquid at mild temperatures. Hazardous substances such as cadmium, mercury, lead, caesium or frankium can be avoided.

Metallic liquids such as indium, indium silver, indium tin, indium tin zinc, indium bismuth, bismuth indium tin, bismuth tin, gallium, gallium indium, gallium indium tin and gallium tin can be applied. For example, the landing areas can be connected to the anode of the component. The landing areas can be defined photolithographically using a lift-off technique. All required photolithography masks can be defined on top of each other before assembly. If a position has been assembled in one step, it is not available to any other component in the next step, even without a resist cover. After the first assembly step, the top resist mask can be selectively removed against the underlying layers, which can be achieved using a plasma ashing step. A possible source of oxygen for this can be nitrous oxide. The photoresist masks should tolerate the solvents at whose interface the semiconductor chips are aligned during the assembly process. For this masking, photo-structurable silicones, photo-structurable spin-on glasses or established processes such as hard-baked photoresist or photo-transferable water-soluble resist can be used. The semiconductor chips, especially semiconductor chips with different emission colors, e.g., for RGB display surfaces, have a rear side covered with a metallic termination layer. The metallic termination layer can be gold, silver, copper, palladium, platinum, nickel gold, nickel palladium gold. The following solvent combinations can be used for the assembly process: Water in heptane (98° C.) and toluene (113° C.), butanol (100° C.), pentanol (138° C.), butyl acetate (126° C.) and monoethylene glycol (197° C.). Sapphire flip chips, thin-film chips and chip-size package components can be used as semiconductor chips.

After assembly, excess semiconductor chips and photoresist layers that are no longer required can be removed. If, as with thin-film chips, the second pole of the diode still has to be connected, a further resist layer can be applied by spray coating and adapted to the exact semiconductor chip position using direct laser exposure, for example. The electrode metal can be deposited. The lift-off technique can create the adapted structured conductor tracks.

To increase the re-melting temperature, a tempering method can be used, for example, with a metallic liquid having different metal layers. The first metal layer can be 3 µm bismuth tin. This metal layer melts at 60° C. The layer consists of about 60 atom % indium, 21 atom % bismuth and otherwise tin. In this example, the rear side of the semiconductor chip is made of gold. During self-organized assembly, the bismuth indium tin layer is kept liquid at 75°, for example. At such mild temperatures, the reactions between the bismuth indium tin layer and the gold rear side of the captured semiconductor chip take place so slowly that isothermal solidification does not occur during self-organized assembly. It is possible to wait a very long time until the concentration of indium and tin in the metallic liquid has been reduced by the addition of gold from the rear side of the chip to such an extent that it solidifies. It is more economical to expose the arrangement to a higher temperature after the assembly step or steps, for example, at 350° C. to accelerate the reaction. The connecting layer becomes thicker, the at least one intermetallic compound is formed, preferably two intermetallic compounds of gold tin and gold indium. Bismuth either remains in the microstructure as bismuth precipitation or forms $Au_2Bi$ as an intermetallic compound together with gold.

EXAMPLE 2

For all semiconductor chips, the landing areas on the substrate can be simultaneously equipped with a metallic liquid already liquid at mild temperatures. For this purpose, layers of indium, indium gold, indium tin, indium tin zinc, bismuth indium, bismuth indium tin, bismuth tin, gallium, gallium indium, gallium indium tin, gallium tin can be applied or layers can be applied that contain the aforementioned constituents as one component. For example, the landing areas can each be connected to the anode of the component. The landing areas can be defined photolithographically using lift-off techniques. The immediately required photolithography mask can be generated prior to each assembly step. The next resist mask can be created after each assembly step, cleaning off excess semiconductor chips and removing the mask that is no longer required. The topography due to the placed semiconductor chips can easily be overmolded with spray coating. The projection exposure provides the necessary depth of field. To increase the re-melting temperature, an electrochemical depletion method can be considered, for example, with a metal layer of 2 µm bismuth indium with 22 atom % bismuth and the rest indium. This metal layer melts at 72° C. After assembly, the ensemble can be immersed at 50° C. in a solution that removes the less noble indium from the compound. Any pore formation can be compensated with a downstream tempering method under pressure.

EXAMPLE 3

The landing areas on the substrate can be applied and defined for the type of semiconductor chips to be placed in the next step. The lift-off technique can preferably be used again to keep the thermal load on the meltable layers as low as possible. The sequence definition of the solder areas, assembly, and removal of excess semiconductor chips can be carried out for each group or type to be placed. As a result, the assembly surface has less topography that can impede contact between the semiconductor chips and the liquid metal landing areas. In this example, a metallic liquid or a liquid metal of a hypereutectic bismuth indium alloy can be produced to capture the semiconductor chips. The increased indium content compared to the eutectic mixture of Example 2 holds available the amount of indium consumed during the initial reaction of indium with an underlying gold layer until an intermetallic gold indium layer has formed. Its layer thickness growth does not increase significantly at the temperature of the self-organized assembly. The reaction of gold with the liquid indium bismuth solution removes indium from the melt. The indium surplus is adjusted such that the eutectic composition is essentially present during assembly to avoid any obstacles to the floating of the semiconductor chips caused by the pasty state of the solder layer. Since bismuth hardly dissolves in gold and gold bismuth forms much more slowly than gold indium compounds, it is sufficient to consider indium here.

Further advantages and developments can be derived from the examples described in the following in connection with the figures.

In the examples and figures, identical, similar or equivalent elements can each be provided with the same reference signs. The elements shown and their proportions are not to be regarded as true to scale. Rather, individual elements such as layers, parts, components and areas, can be represented exaggeratedly large for better representability and/or better understanding.

FIGS. 1A to 1D schematically show a method of manufacturing an optoelectronic component. FIG. 1A provides a substrate 1. The substrate 1 has landing areas 11, in this example, two landing areas. In addition, at least one semiconductor chip 3 is provided, having a metallic termination layer 4 on its rear side 31. The metallic termination layer 4 is shaped like a drop. The landing areas 11 also have a drop shape. The metallic termination layer 4 comprises a second metal, for example, gold.

A metallic liquid 2 is provided on the substrate 1 as shown in FIG. 1B. The metallic liquid 2 is also shaped like a drop. The metallic liquid 2 is arranged on the landing areas 11 of the substrate 1. The metallic liquid 2 comprises at least one first metal Me1, preferably at least two metals. For example, the metallic liquid 2 comprises indium and bismuth.

In the subsequent method step as shown in FIG. 1C, the semiconductor chip 3 is arranged with its rear side 4 on the substrate 1, in particular on the landing areas 11 of the substrate 1. The arrangement is effected by the surface tension of the metallic liquid 2. This is a self-organized arrangement of the semiconductor chips 3 on the metallic liquid 2 so that the first metal Me1 and, optionally, further metals of the metallic liquid 2 and the second metal Me2 of the metallic termination layer 4 form at least one intermetallic compound 6, for example, also more than one intermetallic compound. For example, gold indium and gold bismuth may be formed as intermetallic compounds. The intermetallic compound 6 has a higher re-melting temperature than the melting temperature of the metallic liquid 2. In addition, the self-organized arrangement of the semiconductor chips aligns the semiconductor chips 3 on the substrate 1.

FIGS. 2A to 2E show a method of manufacturing an optoelectronic component.

Figure 2B:
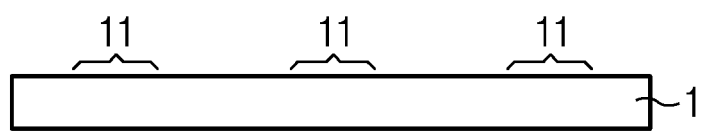

FIG. 2A shows the provision of a substrate 1. The substrate 1 has a plurality of landing areas 11 as shown in FIG. 2B.

Figure 2C:
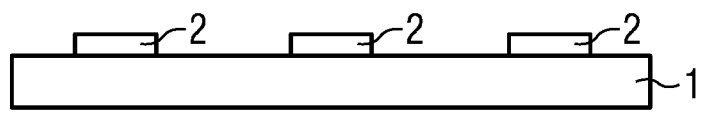
Figure 2D:
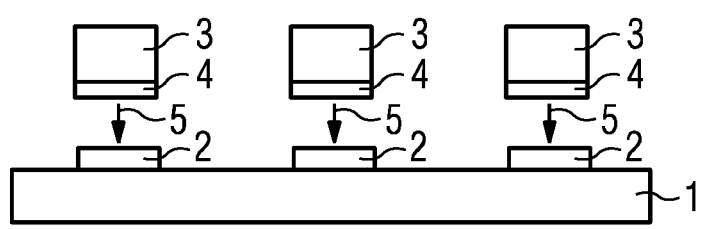

A metallic liquid 2 is arranged on each of the landing areas 11. The metallic liquid 2 can be formed as a layer or as a multi-layer system as shown in FIG. 2C. In addition, semiconductor chips 3 are provided, having a metallic termination layer on their rear side. The semiconductor chips 3, as shown in FIG. 2D, autonomously orient themselves on the metallic liquid 2. The metallic termination layer 4 of the respective semiconductor chips 3 arranges itself directly on the metallic liquid 2. The metallic liquid 2 and the metallic termination layer 4 form at least one intermetallic compound 6. Preferably, the low-melting component in the metallic liquid 2 is depleted so that the intermetallic compound 6 has a re-melting temperature of more than 260° C.

Figure 2E:
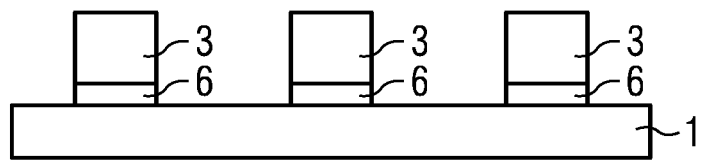

The intermetallic compound 6 forms a connecting element between the semiconductor chip 3 and the substrate 1 as shown in FIG. 2E.

The substrate 1 can be a printed circuit board, for example.

Figure 3:
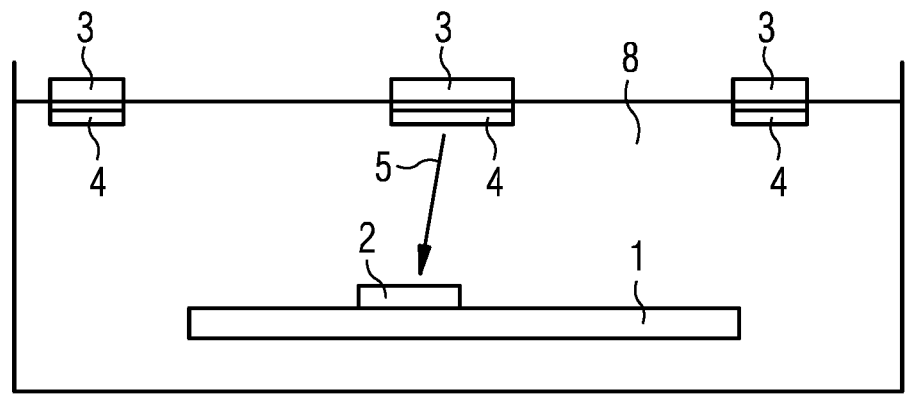
FIG. 3 shows a method step according to an example.

FIG. 3 shows a method step that can be carried out after the method step in FIG. 2B, for example. The substrate 1 can be introduced into a solvent 8. For example, water can be used as a solvent 8. The metallic liquid 2 has a liquid state of aggregation in the solvent. Subsequently, the semiconductor chips 3 can orient themselves on the respective metallic liquid 2 via their rear side in a self-organized manner. Preferably, the semiconductor chips 3 float on the water surface and arrange themselves, oriented by the surface tension, on the metallic liquid 2. Preferably, the semiconductor chips are added in excess so that they can easily attach to the substrate 1 by self-organization.

FIGS. 4A to 4G show a method of manufacturing an optoelectronic component.

Figure 4A:
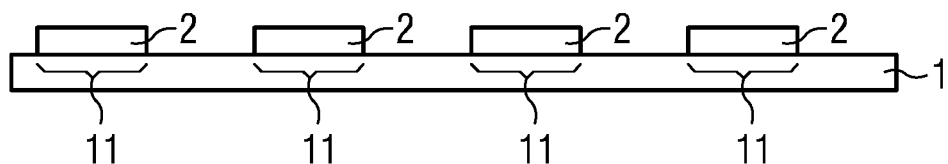
FIGS. 4A to 4G show a method of manufacturing an optoelectronic component according to an example.

FIG. 4A shows the provision of a substrate 1 with landing areas 11 on which a metallic liquid 2 is arranged.

Figure 4B:
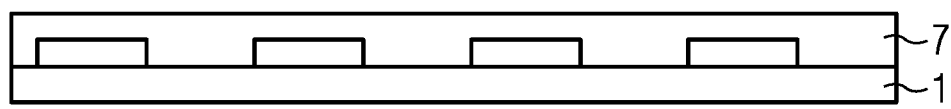

Subsequently, a covering layer 7, in particular a photoresist layer, can be applied to all landing areas 11 on the substrate 1 as shown in FIG. 4B. Its application can be done, for example, by lithography. For example, a photocurable silicone, photocurable spin-on glass, baked photoresist or a photocurable water-soluble coating can be used as the covering layer 7. The coating required for photolithography can be applied by spraying (spray coating), dipping or spin coating.

Figure 4C:
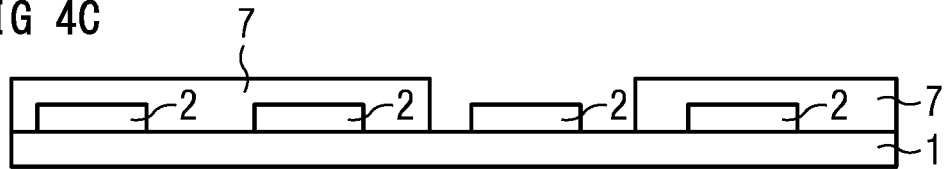

Then, as shown in FIG. 4C, at least part of the landing areas 11 with the metallic liquid 2 can be removed. The removal can be done lithographically, for example. Water, heptane (98° C.)/toluene (113° C.)/butanol (100° C.), pentanol (138° C.)/butyl acetate (126° C.)/monoethylene glycol (197° C.) can be used as solvents. The semiconductor chip 3 can be a thin-film chip or a sapphire flip chip.

Figure 4D:
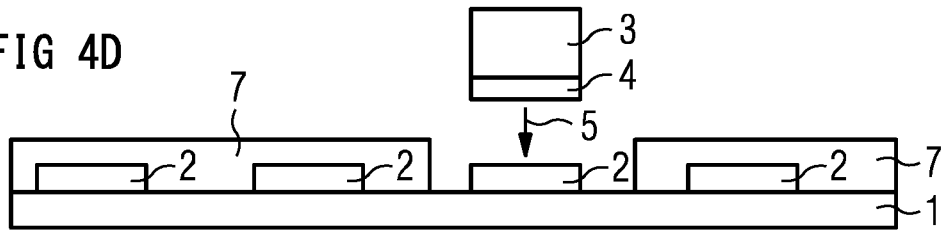

Then, as shown in FIG. 4D, the exposed landing area 11 can be covered or equipped with a semiconductor chip 3. Preferably, more than one semiconductor chip 3 are added so that the semiconductor chips 3 are added in excess. The excess semiconductor chips and the solvent are then removed. The arrangement is dried by evaporation or cleaning. The photoresist can be removed by wet chemical or dry chemical etching.

Figure 4E:
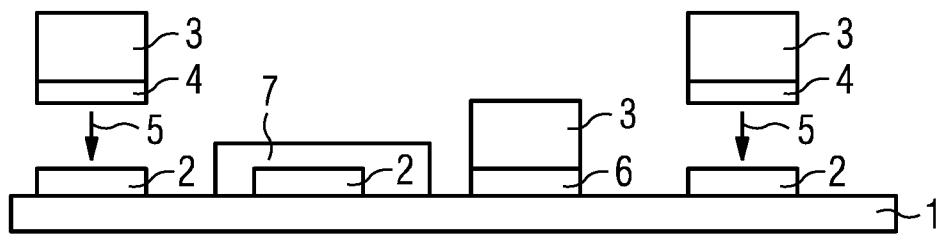

Subsequently, further landing areas 11 covered with the covering layer can be removed as shown in FIG. 4E. This allows further semiconductor chips 3 to be applied to the uncovered landing areas. The landing areas can be activated by either removing the coating layer or exposing the landing area.

The semiconductor chips applied in FIGS. 4D and 4E may differ from each other, for example, in their emission spectrum. For example, red emitting semiconductor chips can be applied in the step shown in FIG. 4D, while blue emitting semiconductor chips can be applied in the step shown in FIG. 4E.

This is followed by the same procedure as already described in connection with the application of the red-emitting semiconductor chip.

The excess of semiconductor chips that do not orient themselves to the landing areas 11 can be removed. The solvent 8 can be removed, for example, by drying by a vacuum or cleaning.

Subsequently, further landing areas 11 can be removed by wet chemical or dry chemical etching.

Figure 4F:
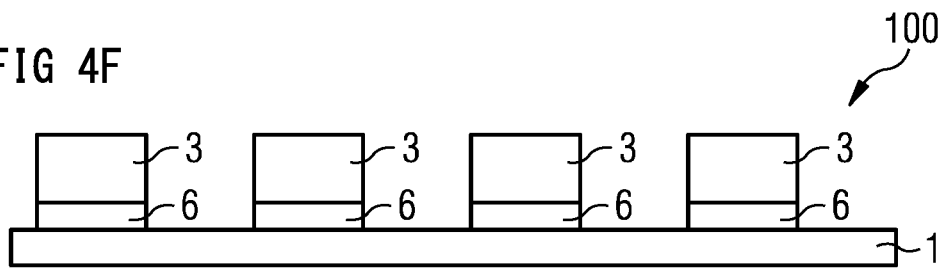

In a further method step, further landing areas 11 previously covered by the covering layer 7 can be equipped with the semiconductor chips 3 as shown in FIG. 4F.

This procedure can be repeated until, for example, all landing areas 11 are covered with semiconductor chips 3. The covering layer 7 can be produced, for example, by BOE (Buffer Oxide Etch), fluoroplasma or argon plasma. The substrate 1 may have a p-contact before the semiconductor chips 3 are applied. The etching processes (wet chemical with window etch solution/buffered oxide etch) or dry chemical (F plasma etching or Ar plasma etching) can remove the covering layer.

The method described in FIGS. 4A to 4G can, for example, be carried out with a photocurable spin-on glass on silsesquioxane. Ethylene glycol (197° C.) can be used as a solvent. A sapphire flip chip with concentric terminal contacts can be used as a semiconductor chip 3. The cleaning step can be carried out with ethanol and dried in a vacuum at 50° C. The photoresist 7 can be removed by dry etching with a fluoroplasma.

Alternatively or additionally, spray coating of a spin-on glass can be carried out. Alternatively, an organic photoresist coating can be used. Water (100° C.) can be used as a solvent 8. The values in brackets indicate the boiling temperatures of the corresponding solvent. A thin-film chip with a p contact and bond pads can be used as a semiconductor chip 3. The solvent 8 can be removed by drying in a vacuum at 50° C. N-methylpyrrolidone (NMP) can be used as a strip resist.

Figure 4G:
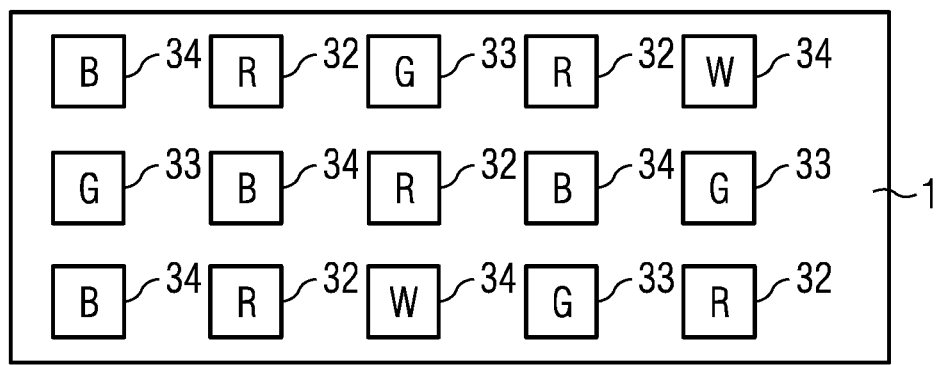

FIG. 4G shows a schematic plan view of an optoelectronic component 100 according to an example. Different types of semiconductor chips 32, 33 and 34 are arranged. The optoelectronic component 100 was produced using our method. Different types of semiconductor chips can thus be easily arranged on a substrate 1. The arrangement of the semiconductor chips on the corresponding landing areas 11 can easily be determined.

FIGS. 5A to 5F show an alternative method of manufacturing an optoelectronic component according to an example.

Figure 5A:
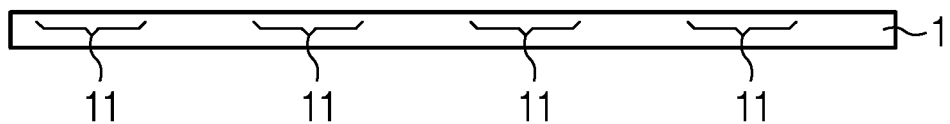
FIGS. 5A to 5F show a method of manufacturing an optoelectronic component according to an example.

FIG. 5A shows the provision of a substrate 1 with landing areas 11, in this example four landing areas. The method of FIGS. 5A to 5F differs from the method of FIGS. 4A to 4G in that here not all landing areas 11 are covered with the metallic liquid 2 right at the beginning of the procedure, but that the corresponding metallic liquid 2 is sequentially applied to the landing area 11 on which the corresponding semiconductor chip 3 finally arranges itself in a self-oriented manner.

Figure 5B:
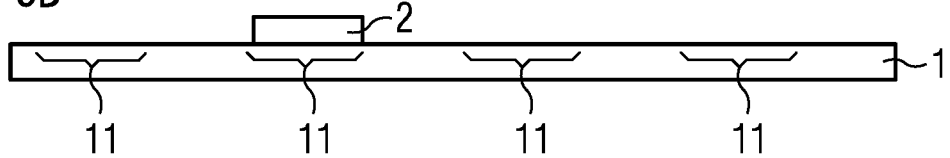
Figure 5C:
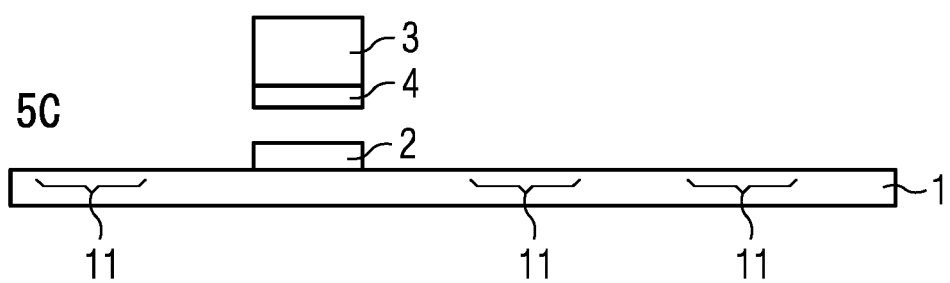

For example, as shown in FIG. 5B, the metallic liquid 2 is applied to only one landing area 11.

Then step C and/or D is performed so that the semiconductor chip 3 connects to this metallic liquid 2 and forms an intermetallic compound 6. This semiconductor chip 3 can be a blue emitting semiconductor chip, for example. The method can take place in a solvent. The solvents already described can be used as solvents.

Afterwards, an excess of semiconductor chips 3 that have not oriented themselves to the landing area 11 and the solvent can be removed. The arrangement of FIG. 5C can be dried by evaporation and cleaned.

Figure 5D:
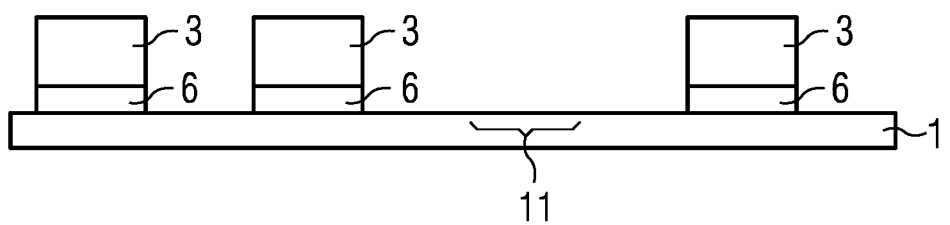

Then, a lithography process with spray coating can take place and another landing area 11 can be coated with the metallic liquid 2. For example, only those landing areas 11 are coated with the metallic liquid 2 on which green emitting semiconductor chips are to arrange themselves later on as shown in FIG. 5D.

Figure 5E:
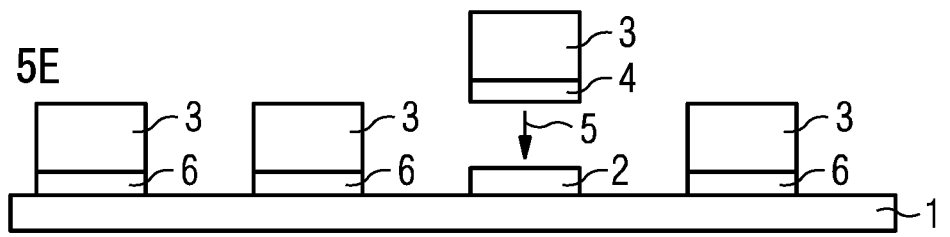
Figure 5F:
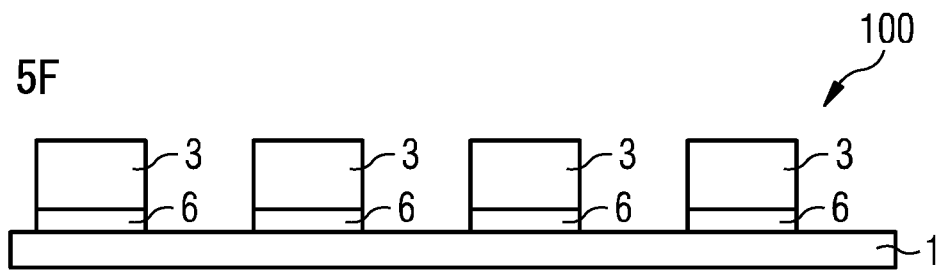

Then the solvent or the excess semiconductor chips can be removed again and the procedure can be repeated until all landing areas 11 are covered with the semiconductor chips 3 as shown in FIGS. 5E and 5F.

For example, in a subsequent step, further landing areas 11 can be covered with red emitting semiconductor chips. This sequence of blue, green and red emitting semiconductor chips can be extended arbitrarily. For example, green emitting or red emitting semiconductor chips can also be applied to the substrate 1 first, followed by blue emitting semiconductor chips. The procedure can be repeated until either all the landing areas 11 are covered with the semiconductor chips 3 or the desired arrangement is achieved.

Figure 6A:
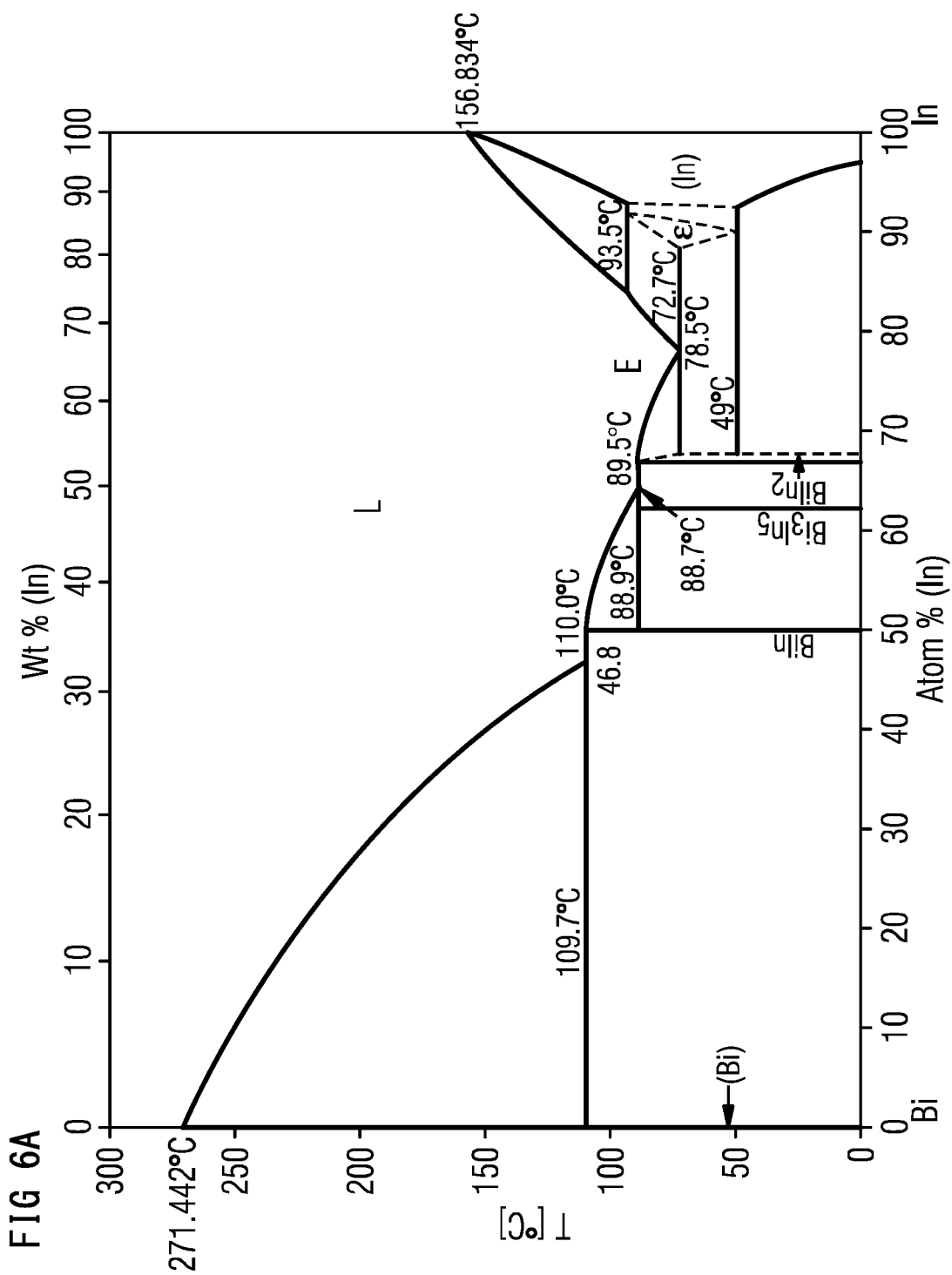
Figure 6B:
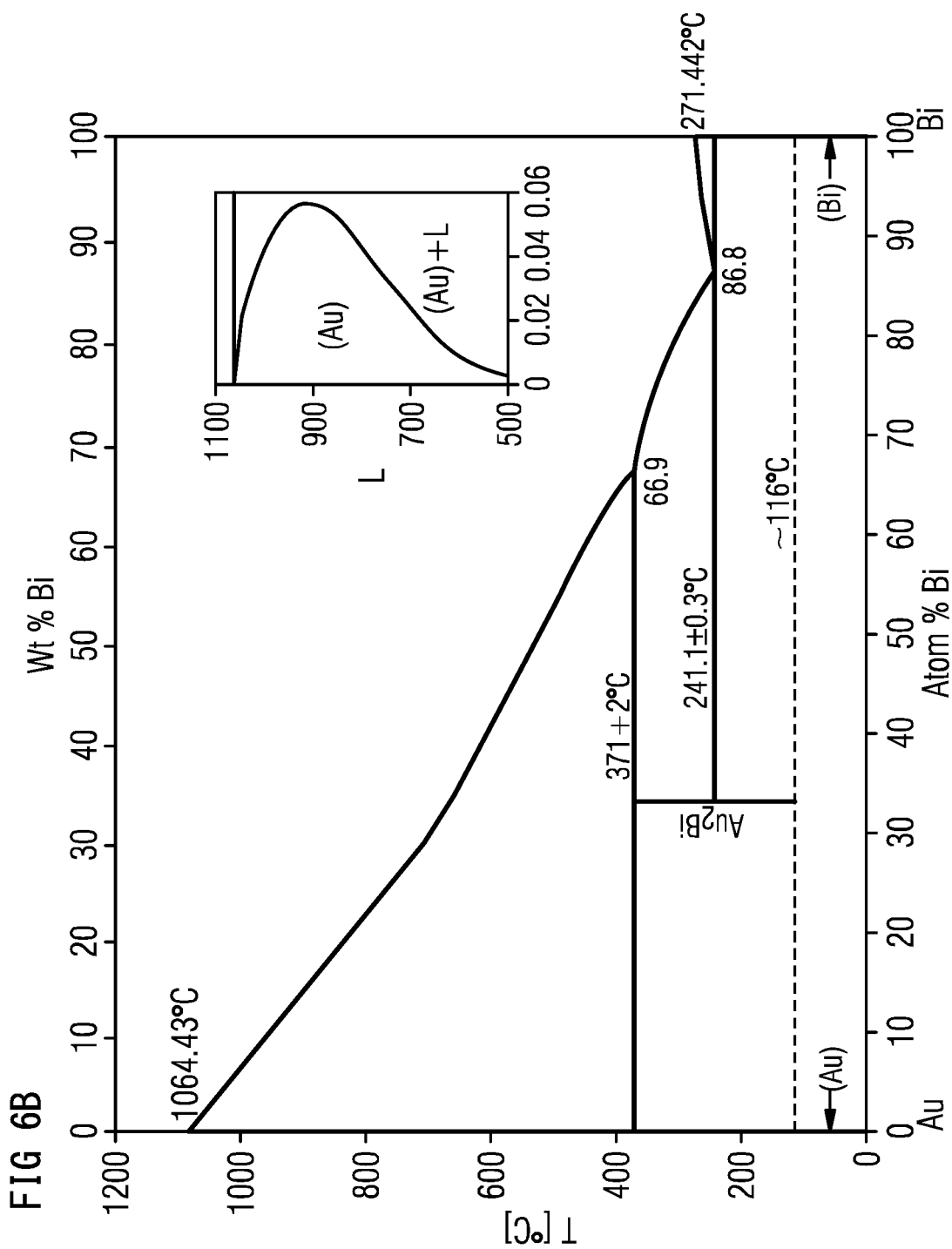

FIGS. 6A to 6C show state diagrams of metals according to an example. The state diagram of bismuth and indium is shown in FIG. 6A. The temperature T in ° C. is shown as a function of the proportion of indium in atomic percent or weight percent. At 78.5° C., bismuth and indium have a eutectic point. At the eutectic point (72.7° C.), a Bi—In mixture with 78.5 atomic % of In melts completely. With a lower or higher In-content, the melting temperature (higher than the eutectic temperature) is indicated by the liquidus lines to the left or right of the eutectic. For example, the metallic liquid 2 may comprise indium and bismuth. Any desired mixing ratio between bismuth and indium can be present in the metallic liquid 2 and thus the melting temperature of the metallic liquid can be set. Bismuth has a melting temperature of 271° C., indium has a melting temperature of 156° C. By mixing indium and bismuth in certain proportions, different melting temperatures can be generated. In particular, the ratio of indium to bismuth shall be selected such that the melting temperature of the indium bismuth mixture is lower than the boiling temperature of the solvent.

FIG. 6B shows a state diagram of gold and bismuth. The temperature T is shown as a function of the proportion of bismuth in atomic percent atom % or weight percent wt % of bismuth. The metallic termination layer 4 may, for example, contain gold. By the reaction of the second metal Me2 of the metallic termination layer 4, i.e., gold, with the metallic liquid 2 of bismuth and indium, an intermetallic compound 6 such as gold indium and gold tin, can be produced. Bismuth either remains in the microstructure as bismuth precipitation or forms gold bismuth as an intermetallic compound together with gold. The intermetallic compound 6 has a higher re-melting temperature than the melting temperature of the metallic liquid.

FIG. 6C shows a state diagram of gold and indium. The temperature Tin ° C. is shown as a function of the proportion of indium in atom % or wt % of indium. Using these state diagrams, suitable first and second metals for the metallic liquid 2 and the metallic termination layer 4, respectively, can be selected to produce a metallic compound 6 having a higher remelting temperature than the melting temperature of the metallic liquid.

The semiconductor chips 3 may be small in size, with the longest edge being shorter than 1 mm, for example.

FIGS. 7A to 7F show a method of manufacturing an optoelectronic component. In this method, several lithographic steps are shown one above the other and alternating between assembly and coating removal.

Figure 7A:
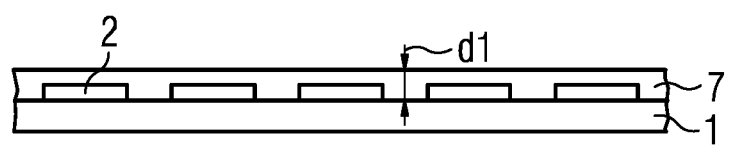
FIGS. 7A to 7I show a method of manufacturing an optoelectronic component according to an example.

FIG. 7A shows the provision of a substrate 1. The metallic liquid 2 is applied to the substrate 1. In addition, the covering layer 7 is applied to the metallic liquid. The covering layer 7 has a layer thickness d1. Then, as shown in FIG. 7B, lithography can be carried out so that at least part of the covering layer 7, preferably above and in some areas of the metallic liquid 2, is removed.

Figure 7B:
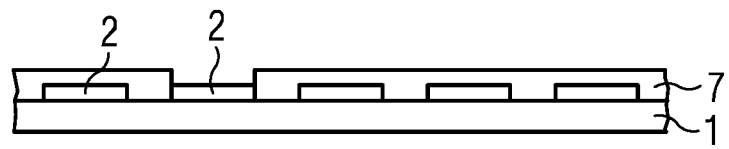
Figure 7C:
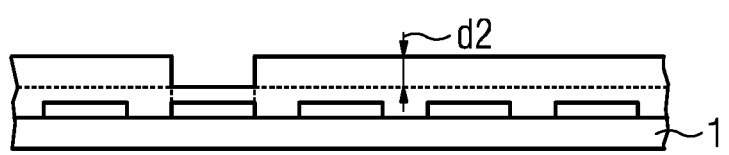

Subsequently, as shown in FIG. 7C, a coating with a layer thickness d2 can be applied. In particular, the layer thickness d2 is greater than the layer thickness d1.

Figure 7D:
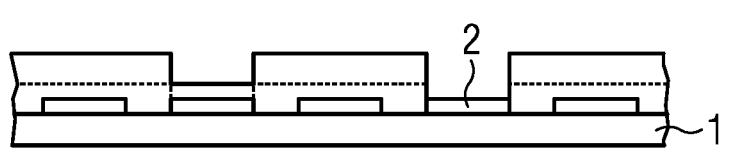

FIG. 7D shows a second lithographic step over a different area of the metallic liquid 2 than that shown in FIG. 7B.

Figure 7E:
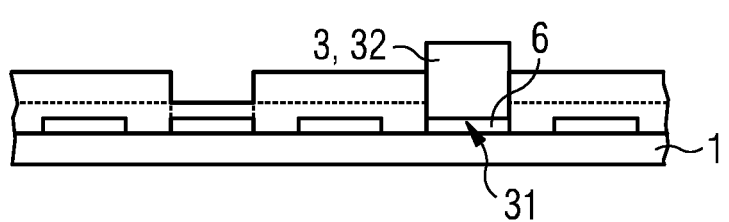

The semiconductor chip 3 can then be mounted on the exposed metallic liquid 2, forming an intermetallic compound 6 as shown in FIG. 7E.

Figure 7F:
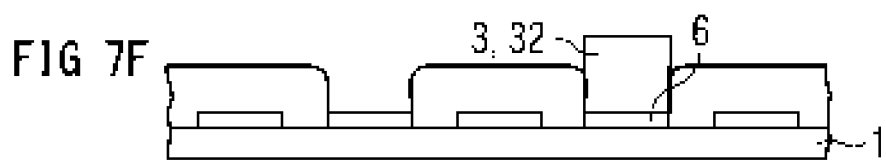

In the subsequent method step as shown in FIG. 7F, a surface etching can be carried out, for example, with $O_2$ plasma.

Figure 7G:
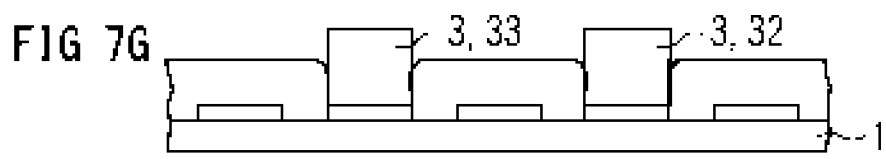

Then, as shown in FIG. 7G, another semiconductor chip 3 can be applied to the exposed landing area. The now applied semiconductor chip 3 can be different from the previously applied semiconductor chip. In particular, the semiconductor chip now applied is a second type of semiconductor chip, while the semiconductor chip previously applied is a first type of semiconductor chip.

Figure 7H:
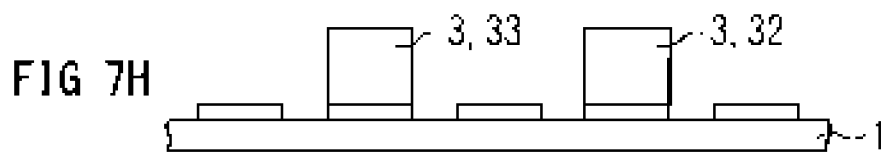

In the subsequent method step as shown in FIG. 7H, a surface etching can be carried out. This also allows the previously covered landing areas with the metallic liquid 2 to be exposed.

Figure 7I:
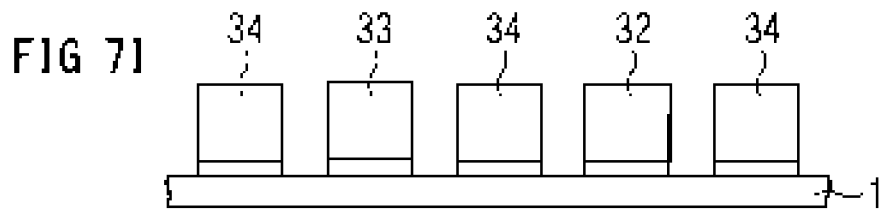

In the subsequent method step as shown in FIG. 7I, further types of semiconductor chips can be applied to the exposed landing areas.

The examples described in connection with the figures and their features can also be combined with each other according to further examples, even if such combinations are not explicitly shown in the figures. Furthermore, the examples described in connection with the figures may have additional or alternative features as described in the general part.

Our methods and components are not limited to the examples by the description using the same. Rather, this disclosure includes any new feature and any combination of features that in particular includes any combination of features in the appended claims, even if the feature or combination itself is not explicitly mentioned in the claims or the examples.

This application claims priority of DE 10 2017 104 886.3, the subject matter of which is incorporated herein by reference.

The invention claimed is:

1. A method of manufacturing an optoelectronic component comprising:
   A) providing a substrate,
   B) providing a metallic liquid arranged in a structured manner and in direct mechanical contact on the substrate and comprising at least one first metal,
   C) providing semiconductor chips each having a metallic termination layer on their rear side, the metallic termination layer comprising at least one second metal different from the first metal, and
   D) self-organized arranging the semiconductor chips on the metallic liquid so that the first metal and the second metal form at least one intermetallic compound having a higher re-melting temperature than the melting temperature of the metallic liquid, wherein the intermetallic compound is a connecting layer between the substrate and the semiconductor chips,
   wherein the substrate has a plurality of landing areas each configured to accommodate a semiconductor chip,
   the metallic liquid is arranged on all landing areas,
   subsequently, at least part of the landing areas is covered with a covering layer so that the semiconductor chips arrange themselves in a self-organized manner exclusively on the uncovered landing areas, and
   the covered landing areas remain free of the semiconductor chips.

2. The method according to claim 1, wherein the substrate is introduced in a solvent, the semiconductor chips subsequently are introduced into the solvent, and the semiconductor chips arrange themselves in a self-organized manner on the landing areas.

3. The method according to claim 2, wherein, after D), the solvent is removed and the semiconductor chips are cleaned by evaporation or a cleaning reagent.

4. The method according to claim 2, wherein the solvent is water, heptane, toluene, butanol, pentanol, butyl acetate, 1-methoxy-2-propylacetate, monoethylene glycol or a combination thereof.

5. The method according to claim 1, wherein step D) is sequential.

6. The method according to claim 1, wherein, in D), first, a first type of semiconductor chips, then a second type of semiconductor chips and then optionally further types of semiconductor chips arrange themselves in a self-organized manner, the types of semiconductor chips are configured for radiation emission, and a peak wave maxima of radiations of the first, second and further types of semiconductor chips are different.

7. The method according to claim 1, wherein the covering layer is subsequently removed from part of the covered landing areas so that uncovered landing areas are produced, further semiconductor chips subsequently arrange themselves in a self-organized manner exclusively on the uncovered landing areas, and the covered landing areas remain free of the semiconductor chips.

8. The method according to claim 1, wherein the covering layer is removed from the landing areas sequentially until a semiconductor chip has arranged itself in a self-organized manner on each of the landing areas.

9. The method according to claim 1, wherein the semiconductor chips are added in excess and, after D), the semiconductor chips not having arranged themselves in a self-organized manner are removed.

10. The method according to claim 1, wherein the covering layer is a photoresist layer.

11. The method according to claim 1, wherein the landing areas are arranged in a matrix.

12. The method according to claim 1, wherein the second metal comprises a metal or a mixture of several metals and is selected from the group consisting of Au, Ag, Cu, Pd, Ni and Pt.

13. The method according to claim 1, wherein the first metal comprises a metal or a mixture of several metals and is selected from the group consisting of Ga, In, Ag, Sn, Zn, Bi, InAg, InSn, InSnZn, BiIn, BiInSn, BiSn, GaIn, GaInSn and GaSn.

14. The method according to claim 1, wherein the re-melting temperature of the intermetallic compound is greater than 260° C.

15. The method according to claim 1, wherein the substrate is a circuit board.

16. The method according to claim 1, wherein the metallic liquid comprises an alloy of Bi, In and Sn, the second metal is Au, and the intermetallic compound comprises AuSn and/or AuIn.

17. An optoelectronic component obtained according to the method of claim 1, said component comprising a composite of semiconductor chips arranged on a substrate.

18. A method of manufacturing an optoelectronic component comprising:
A) providing a substrate,
B) providing a metallic liquid arranged in a structured manner and in direct mechanical contact on the substrate and comprising at least one first metal,
C) providing semiconductor chips each having a metallic termination layer on their rear side, the metallic termination layer comprising at least one second metal different from the first metal, and
D) self-organized arranging the semiconductor chips on the metallic liquid so that the first metal and the second metal form at least one intermetallic compound having a higher re-melting temperature than the melting temperature of the metallic liquid, wherein the intermetallic compound is a connecting layer between the substrate and the semiconductor chips,
wherein, in D), first, a first type of semiconductor chips, then a second type of semiconductor chips and then, optionally, further types of semiconductor chips arrange themselves in a self-organized manner, the types of semiconductor chips are configured for radiation emission, and a peak wave maxima of radiations of the first, second and further types of semiconductor chips are different.

* * * * *